United States Patent
Son

(10) Patent No.: US 12,557,589 B2
(45) Date of Patent: Feb. 17, 2026

(54) WAFER TREATMENT APPARATUS CAPABLE OF MEASURING WARPAGE OF WAFER AND METHOD OF MEASURING WARPAGE OF WAFER

(71) Applicant: SEMES CO., LTD., Cheonan-si (KR)

(72) Inventor: Young Jun Son, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 457 days.

(21) Appl. No.: 18/098,156

(22) Filed: Jan. 18, 2023

(65) Prior Publication Data

US 2023/0282501 A1    Sep. 7, 2023

(30) Foreign Application Priority Data

Mar. 7, 2022    (KR) .................. 10-2022-0028956

(51) Int. Cl.
*H01L 21/67*    (2006.01)
*H01L 21/66*    (2006.01)

(52) U.S. Cl.
CPC ........ *H01L 21/67288* (2013.01); *H01L 22/12* (2013.01)

(58) Field of Classification Search
None
See application file for complete search history.

(56) References Cited

U.S. PATENT DOCUMENTS

2012/0279955 A1* 11/2012 Tadokoro .......... H01L 21/67248
                                                       219/448.12
2013/0003250 A1    1/2013 Morimoto

FOREIGN PATENT DOCUMENTS

| KR | 10-2010-0107131 | 10/2010 |
| KR | 10-2013-0007628 | 1/2013 |
| KR | 10-2021-0133556 | 11/2021 |

OTHER PUBLICATIONS

Highly stretchable, transparent ionic touch panel by Chong-Chan Kim, Hyun-Hee Lee, Kyu Hwan Oh, and Jeong-Yun Sun, published Aug. 12, 2016, Science vol. 353 Issue 5300.

* cited by examiner

*Primary Examiner* — Michelle Mandala

(57) ABSTRACT

Provided is a wafer treatment apparatus capable of measuring warpage of a wafer, the wafer treatment apparatus including a support plate providing a surface on which the wafer is supported, a temperature control channel mounted in the support plate to provide a path through which a fluid flows, and a plurality of warpage measurers disposed on the support plate and having lower ends mounted to be vertically spaced apart from an upper portion of the temperature control channel.

19 Claims, 8 Drawing Sheets

WAFER TREATMENT APPARATUS CAPABLE OF MEASURING WARPAGE OF WAFER AND METHOD OF MEASURING WARPAGE OF WAFER

CROSS-REFERENCE TO RELATED PATENT APPLICATION

This application claims the benefit of Korean Patent Application No. 10-2022-0028956, filed on Mar. 7, 2022, in the Korean Intellectual Property Office, the disclosure of which is incorporated herein in its entirety by reference.

BACKGROUND OF THE INVENTION

1. Field of the Invention

The present invention relates to a semiconductor apparatus and, more particularly, to a wafer treatment apparatus and a method of measuring warpage of a wafer.

2. Description of the Related Art

Various processes such as photolithography, etching, ashing, ion injection, deposition, and cleaning are performed on a wafer to manufacture semiconductor devices, and various wafer treatment apparatuses are used for such processes. Circuit patterns are getting finer and denser due to the increase in performance of semiconductor devices. From among the semiconductor devices, for memory devices, thin films are stacked in multiple layers to increase storage capacity.

A process of manufacturing three-dimensional vertical NAND (V-NAND) flash memory may include a process of cooling the wafer to a desired temperature. For example, the wafer may be cooled to a certain temperature before a coating process. Although other processes are performed after the cooling process, when the number of V-NAND layers increases, warpage of the wafer may cause defects.

A method of disposing a plurality of pressure sensors at a plurality of points under a wafer, and measuring warpage of the wafer based on how much the pressure sensors are pressed has been disclosed. However, wires for receiving signals from the plurality of pressure sensors may cause a complicated configuration of a wafer supporter and difficulty of a design for avoiding interference with other elements. As such, a technology capable of measuring warpage of a wafer in real time with a simple configuration is required.

SUMMARY OF THE INVENTION

The present invention provides a wafer treatment apparatus capable of measuring warpage of a wafer, and a method of measuring warpage of the wafer.

The present invention also provides a wafer treatment apparatus having a simple configuration and capable of measuring warpage of a wafer in real time during a wafer treatment process, and a method of measuring warpage of the wafer.

However, the scope of the present invention is not limited thereto.

According to an aspect of the present invention, there is provided a wafer treatment apparatus capable of measuring warpage of a wafer, the wafer treatment apparatus including a support plate providing a surface on which the wafer is supported, a temperature control channel mounted in the support plate to provide a path through which a fluid flows, and a plurality of warpage measurers disposed on the support plate and having lower ends mounted to be vertically spaced apart from an upper portion of the temperature control channel.

When the warpage measurers are pressed by a weight of the wafer, the lower ends of the warpage measurers may come into contact with the fluid of the temperature control channel.

The plurality of warpage measurers may be mounted at positions corresponding to a plurality of portions of the wafer, and a certain warpage measurer corresponding to a portion positioned lower than a plane of the wafer due to warpage of the wafer may be pressed first to contact the fluid of the temperature control channel.

The warpage measurers may be disposed in recesses provided on the support plate, and each warpage measurer may include an upper contact capable of contacting the wafer, a lower contact capable of contacting the fluid of the temperature control channel, and an elastic supporter elastically supporting the upper and lower contacts in the recess.

When a weight is not applied onto the upper contact, the elastic supporter may support to maintain a certain distance between the lower contact and the temperature control channel.

The lower contact may include a conductive material.

The wafer treatment apparatus may further include a dielectric between the upper and lower contacts.

The wafer treatment apparatus may further include at least one ground warpage measurer disposed on the support plate and mounted not to be vertically spaced apart from the temperature control channel.

A first electrode may be connected to an end of the temperature control channel, and a second electrode may be connected to another end of the temperature control channel.

When at least any one warpage measurer from among the plurality of warpage measurers is in contact with the fluid of the temperature control channel, contact currents may be induced from the first and second electrodes to the contact point.

A first ammeter may be connected to the first electrode, a second ammeter may be connected to the second electrode, and the wafer treatment apparatus may further include a controller for obtaining values of currents measured by the first and second ammeters.

When a length of the temperature control channel is denoted by L and a total current flowing through the temperature control channel is denoted by $I_t$, and when the warpage measurer is in contact with the fluid at a portion corresponding to $\alpha L$ from the end of the temperature control channel and $(1-\alpha)L$ from the other end of the temperature control channel, the controller may obtain a contact position $\alpha$ as shown in Equation (1) $(1-\alpha)=I_1/I_t$, and Equation (2) $\alpha=I_2/I_t$ (where $I_1$ denotes the current measured by the first ammeter, $I_2$ denotes the current measured by the second ammeter, and $0 \leq \alpha \leq 1$).

The controller may measure warpage of the wafer by obtaining at least two contact positions $\alpha$.

When the current measured by the first ammeter is denoted by $I_1$ and the current measured by the second ammeter is denoted by $I_2$, a sum of $I_1$ and $I_2$ may be constant, and $I_1$ and $I_2$ may have inversely proportional values based on a contact position between the fluid of the temperature control channel and the warpage measurer.

The wafer treatment apparatus may further include a fluid supplier connected to an end of the temperature control channel to supply the fluid to the temperature control channel, and a fluid discharger connected to another end of the temperature control channel to discharge the fluid from the temperature control channel.

The temperature control channel may control a temperature of the wafer supported on the support plate, by providing coldness to the support plate.

The wafer treatment apparatus may further include a plurality of suckers provided on the support plate to apply a suction pressure to a lower surface of the wafer supported on the support plate.

According to another aspect of the present invention, there is provided a method of measuring warpage of a wafer by using a wafer treatment apparatus including a support plate providing a surface on which the wafer is supported, a temperature control channel mounted in the support plate to provide a path through which a fluid flows, and a plurality of warpage measurers disposed on the support plate and having lower ends mounted to be vertically spaced apart from an upper portion of the temperature control channel, wherein the plurality of warpage measurers are mounted at positions corresponding to a plurality of portions of the wafer, wherein a certain warpage measurer corresponding to a portion positioned lower than a reference horizontal plane of the wafer due to warpage of the wafer is pressed first to contact the fluid of the temperature control channel, wherein contact currents are induced from the temperature control channel to a contact point between the warpage measurer and the temperature control channel, wherein, when a current measured at an end of the temperature control channel is denoted by $I_1$ and a current measured at another end of the temperature control channel is denoted by $I_2$, a sum of $I_1$ and $I_2$ is constant, and $I_1$ and $I_2$ have inversely proportional values based on a contact position between the fluid of the temperature control channel and the warpage measurer, and wherein the contact position is obtained by calculating a ratio of $I_1$ to $I_2$.

Warpage of the wafer may be measured by detecting at least two contact positions.

According to another aspect of the present invention, there is provided a wafer treatment apparatus capable of measuring warpage of a wafer, the wafer treatment apparatus including a support plate providing a surface on which the wafer is supported, a temperature control channel mounted in the support plate to provide a path through which a fluid flows, a plurality of warpage measurers disposed on the support plate and having lower ends mounted to be vertically spaced apart from an upper portion of the temperature control channel, a first electrode and first ammeter connected to an end of the temperature control channel, and a second electrode and second ammeter connected to another end of the temperature control channel, wherein the plurality of warpage measurers are mounted at positions corresponding to a plurality of portions of the wafer, wherein a certain warpage measurer corresponding to a portion positioned lower than a plane of the wafer due to warpage of the wafer is pressed first to contact the fluid of the temperature control channel, wherein, when the certain warpage measurer is in contact with the temperature control channel, contact currents are induced from the first and second electrodes to the contact point, and a controller obtains values of currents measured by the first and second ammeters, and wherein, when a length of the temperature control channel is denoted by L and a total current flowing through the temperature control channel is denoted by $I_t$, and when the certain warpage measurer is in contact with the fluid at a portion corresponding to $\alpha L$ from the end of the temperature control channel and $(1-\alpha)L$ from the other end of the temperature control channel, the controller obtains a contact position $\alpha$ as shown in Equation (1) $(1-\alpha)=I_1/I_t$, and Equation (2) $\alpha=I_2/I_t$ (where $I_1$ denotes the current measured by the first ammeter, $I_2$ denotes the current measured by the second ammeter, and $0\leq\alpha\leq1$), and measures warpage of the wafer by obtaining at least two contact positions $\alpha$.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
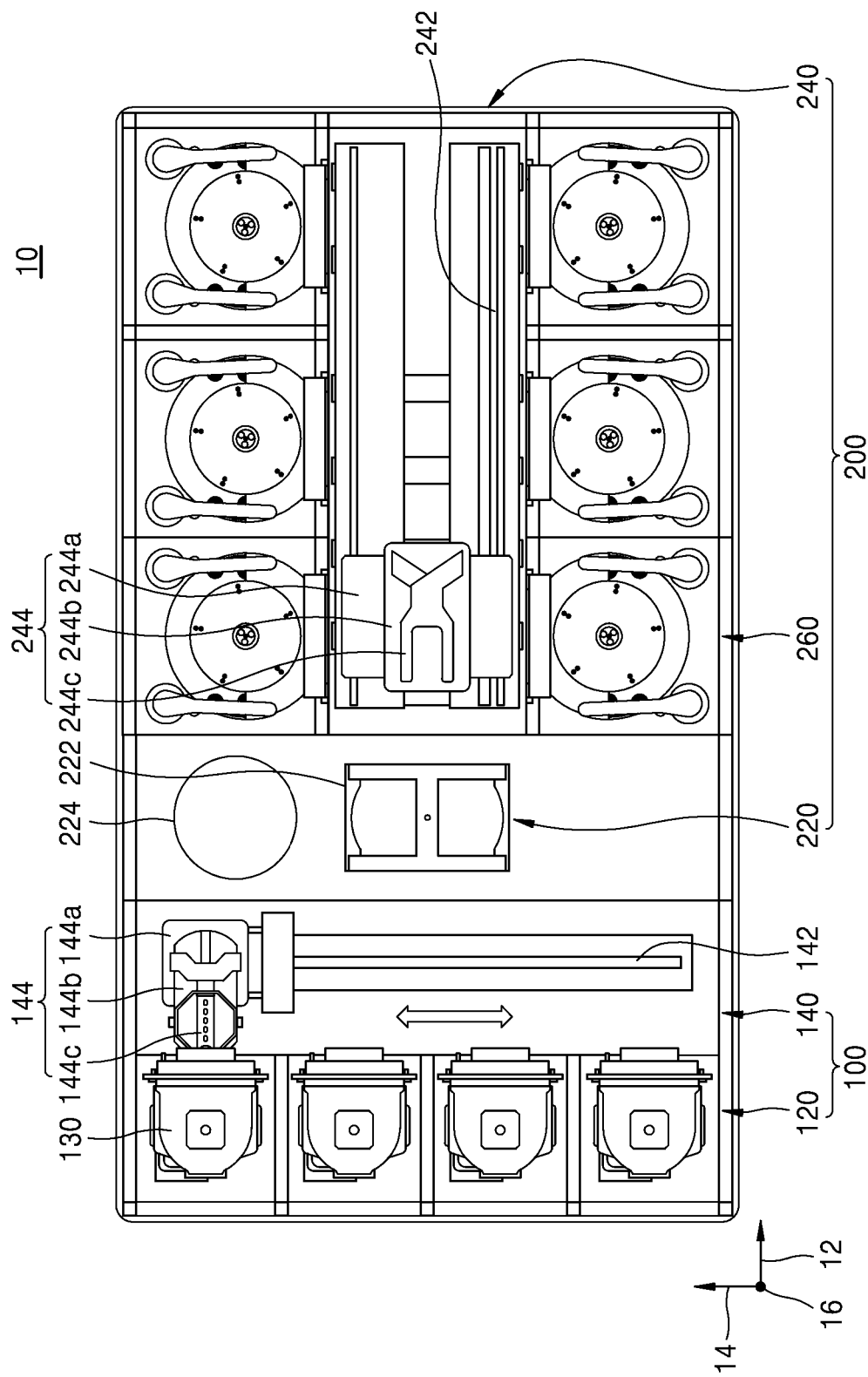
FIG. 1 is a plan view of a wafer treatment system according to an embodiment of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity or convenience of explanation.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

FIG. 1 is a plan view of a wafer treatment system 10 according to an embodiment of the present invention.

Referring to FIG. 1, the wafer treatment system 10 includes an index module 100 and a process treatment module 200. The index module 100 includes load ports 120 and a transport frame 140. The load ports 120, the transport frame 140, and the process treatment module 200 may be sequentially arranged. Herein, a direction in which the load ports 120, the transport frame 140, and the process treatment module 200 are arranged is referred to as a first direction 12 (or an x-axis direction), a direction perpendicular to the first direction 12 when viewed from above is referred to as a second direction 14 (or an y-axis direction), and a direction perpendicular to a plane including the first and second directions 12 and 14 (i.e., an xy plane) is referred to as a third direction 16 (or a z-axis direction).

Carriers 130 containing wafers W are seated on the load ports 120. A plurality of load ports 120 may be disposed along the second direction 14. The number of load ports 120 may increase or decrease depending on process efficiency of the process treatment module 200, production efficiency, or the like. Each carrier 130 may use a front opening unified pod (FOUP) and include slots for holding a plurality of wafers W horizontally.

The process treatment module 200 includes a buffer unit 220, a transport chamber 240, and process chambers 260. The transport chamber 240 may extend in parallel with the first direction 12, and the process chambers 260 may be disposed at both sides in a lengthwise direction of the transport chamber 240. Some of the process chambers 260 may be stacked on one another. Meanwhile, the process chambers 260 may be disposed only at one side of the transport chamber 240.

The buffer unit 220 is disposed between the transport frame 140 and the transport chamber 240 to provide a space where the wafers W stay before being transported between the transport frame 140 and the transport chamber 240. The buffer unit 220 includes a slot unit 222 where the wafers W are disposed, and a heat treatment chamber 224. The buffer unit 220 may be provided to be open or openable to the transport frame 140 and the transport chamber 240.

The slot unit 222 provides a plurality of slots where the wafers W are disposed when transported between the transport frame 140 and the transport chamber 240 or between the process chambers 260.

The heat treatment chamber 224 performs heat treatment on the wafers W before the wafers W are transported to the transport chamber 240. For example, the heat treatment chamber 224 may heat or cool the wafers W before a liquid is coated on the wafers W in the process chambers 260. In the following description, the heat treatment chamber 224 is assumed as a cooling chamber 224 for cooling the wafers W.

The transport frame 140 may transport the wafers W between the carriers 130 and the buffer unit 220. The transport frame 140 is provided with an index rail 142 and an index robot 144. The index rail 142 may extend in parallel with the second direction 14, and the index robot 144 may be mounted thereon to move along the second direction 14. The index robot 144 includes a base 144a, a body 144b, and an index arm 144c. The base 144a is provided to be movable along the index rail 142. The body 144b is coupled to the base 144a, and is provided to be rotatable and movable along the third direction 16 on the base 144a. The index arm 144c is coupled to the body 144b, and is provided to be movable away from or toward the body 144b. A plurality of index arms 144c may be provided and individually driven. Each index arm 144c may be used to transport the wafer W from the carrier 130 to the process treatment module 200, or from the process treatment module 200 to the carrier 130.

The transport chamber 240 transports the wafers W between the buffer unit 220 and the process chambers 260 or between the process chambers 260. The transport chamber 240 is provided with a guide rail 242 and a main robot 244. The guide rail 242 may extend in parallel with the first direction 12, and the main robot 244 may be mounted thereon to move along the first direction 12. The main robot 244 includes a base 244a, a body 244b, and a main arm 244c. The base 244a is provided to be movable along the guide rail 242. The body 244b is coupled to the base 244a, and is provided to be rotatable and movable along the third direction 16 on the base 244a. The main arm 244c is coupled to the body 244b, and is provided to be movable away from or toward the body 244b. A plurality of main arms 244c may be provided and individually driven.

Each process chamber 260 is provided with a process module for performing a process on the wafer W. The process module may be provided as a cleaning apparatus, a heating apparatus, an etching apparatus, a photolithography apparatus, or the like. The process module may have a different structure depending on the performed process. Meanwhile, the process modules in all process chambers 260 may have the same structure, or the process modules in the process chambers 260 belonging to the same group may have the same structure. The process modules in the process chambers 260 belonging to different groups may have different structures.

Figure 2:
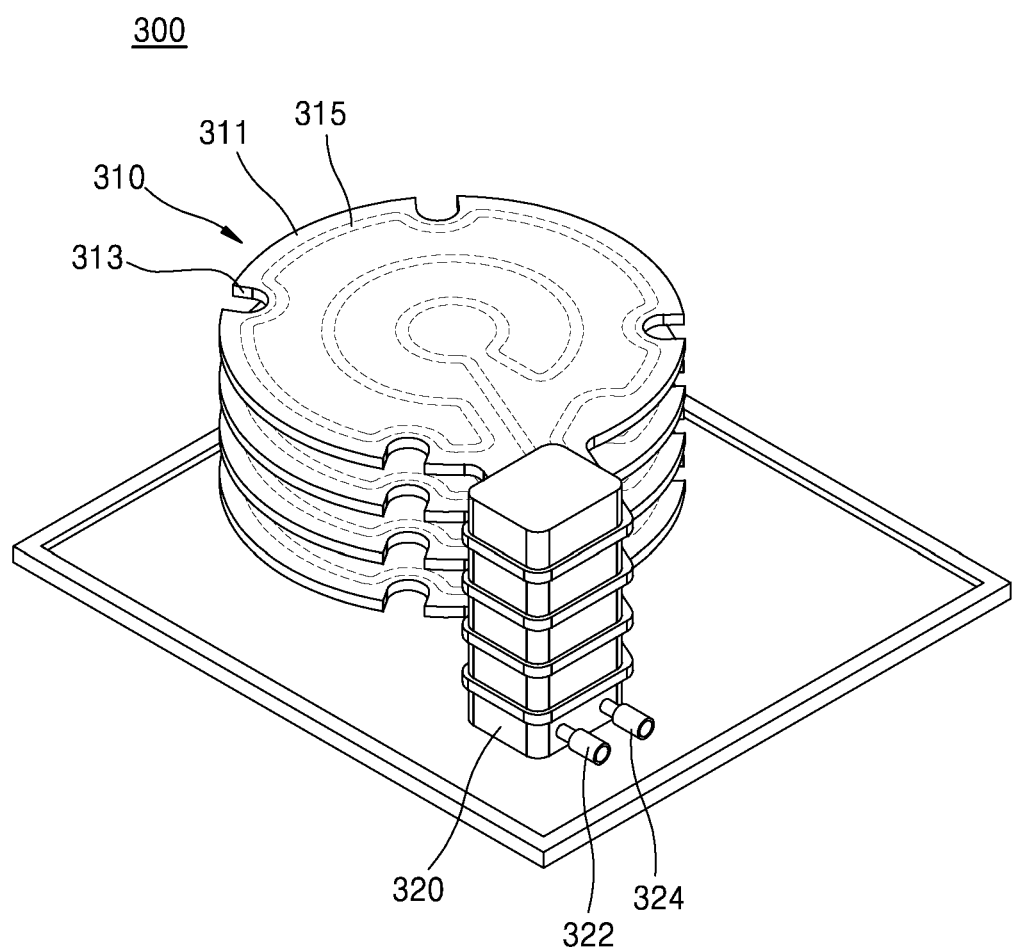
FIG. 2 is a schematic view of a wafer treatment apparatus according to an embodiment of the present invention.
Figure 3:
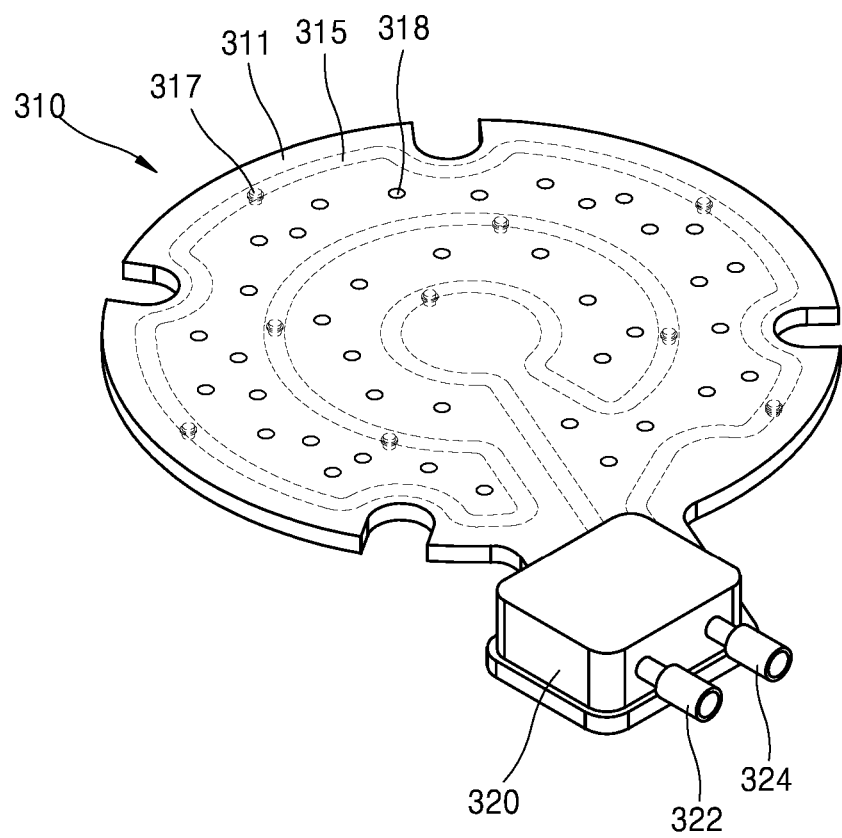
FIG. 3 is a schematic view showing the disposition of a temperature control channel and warpage measurers according to an embodiment of the present invention.
Figure 4:
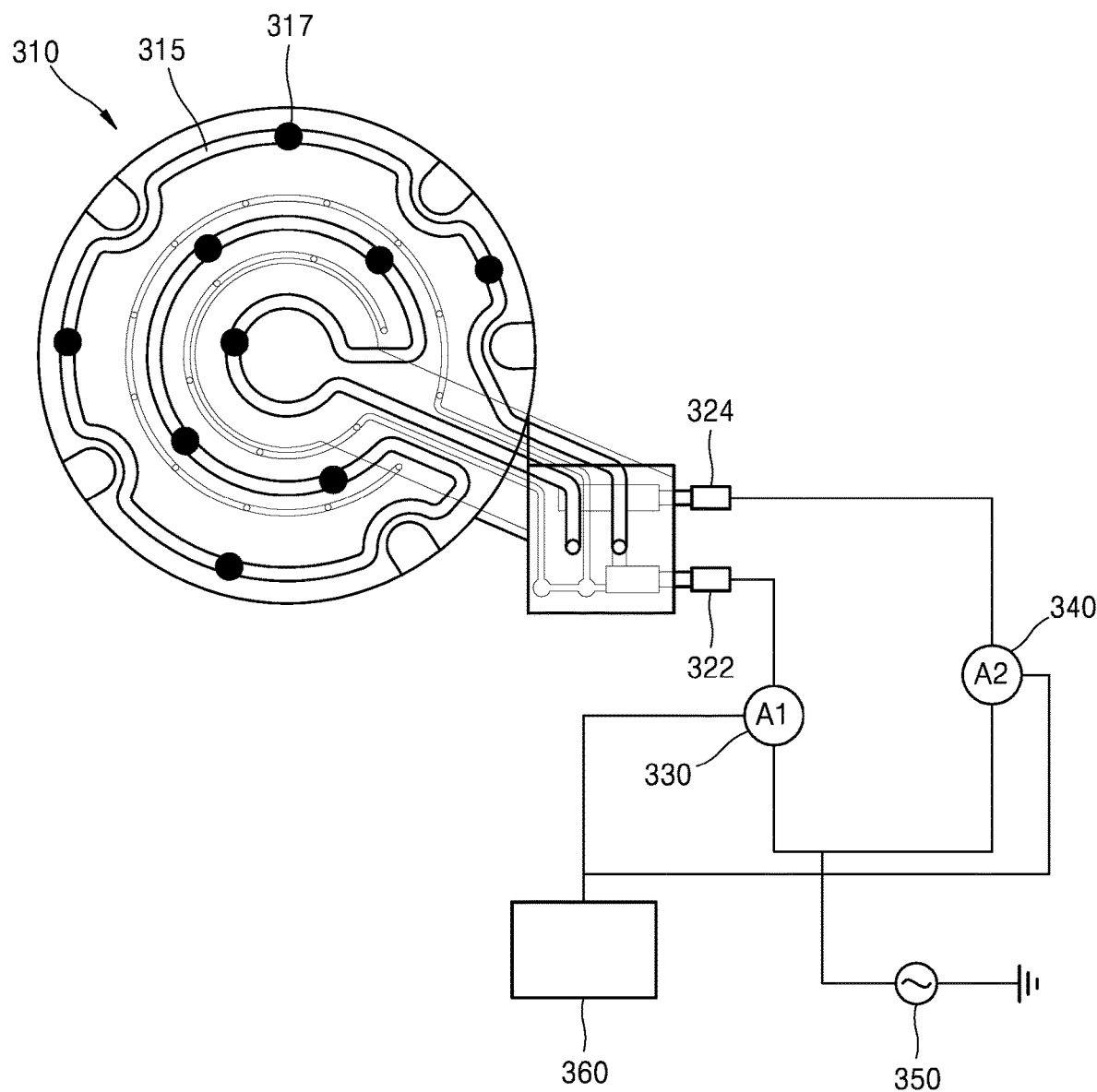
FIG. 4 is a plan view of a wafer treatment apparatus according to an embodiment of the present invention.
Figure 5:
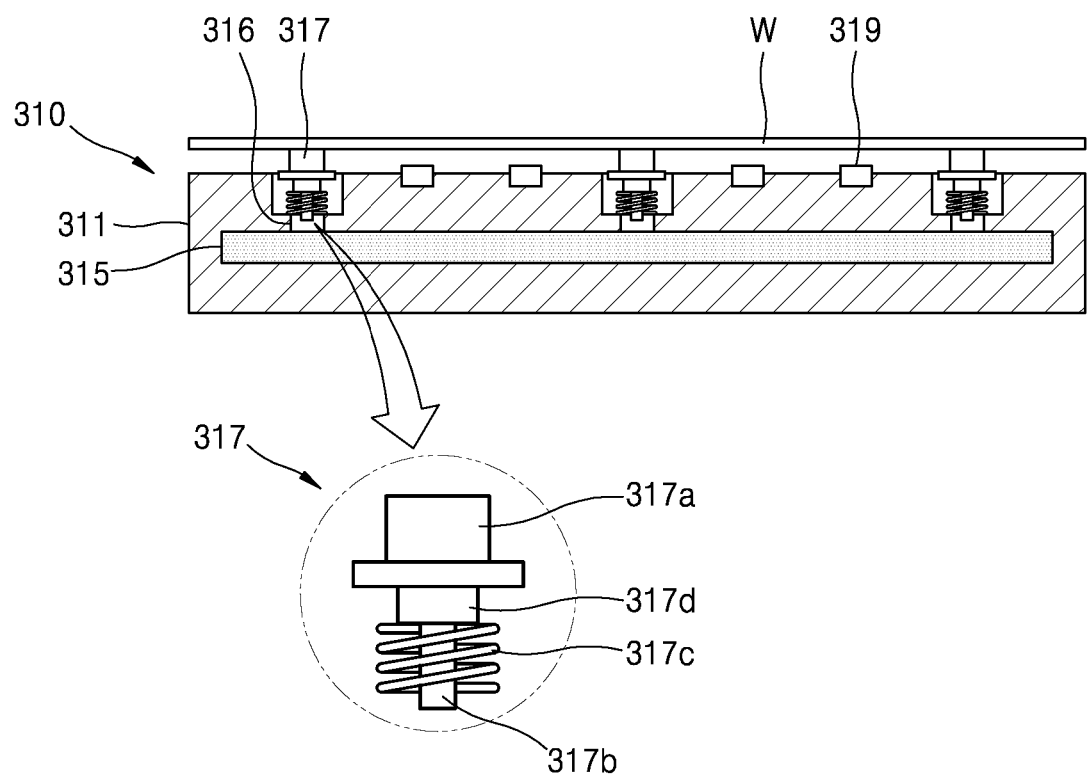
FIG. 5 is a side cross-sectional view of a wafer treatment apparatus according to an embodiment of the present invention.

FIG. 2 is a schematic view of a wafer treatment apparatus 300 according to an embodiment of the present invention. FIG. 3 is a schematic view showing the disposition of a temperature control channel 315 and warpage measurers 317 according to an embodiment of the present invention. FIG. 4 is a plan view of the wafer treatment apparatus 300 according to an embodiment of the present invention. FIG. 5 is a side cross-sectional view of the wafer treatment apparatus 300 according to an embodiment of the present invention.

The wafer treatment apparatus 300 may be disposed in the cooling chamber 224 of the buffer unit 220. The cooling chamber 224 may cool the wafers W before a liquid is coated on the wafers W in the process chambers 260. The wafer treatment apparatus 300 is described herein as an apparatus for cooling the wafers W in the buffer unit 220, but is not limited thereto. It is noted that the wafer treatment apparatus 300 is applicable, without limitation, to a heat treatment apparatus for heating or cooling the wafers W while supporting the wafers W in a space other than the buffer unit 220.

Referring to FIGS. 2 to 5, each measurement structure 310 of the wafer treatment apparatus 300 includes a support plate 311, the temperature control channel 315, and the warpage measurers 317. The measurement structure 310 of the wafer treatment apparatus 300 is provided to cool the supported wafer W and measure warpage of the wafer W at the same time.

The support plate 311 provides a surface on which the wafer W is supported. A lower surface of the wafer W may be supported on an upper surface of the support plate 311 to perform the cooling process. The support plate 311 may serve as a housing in which the other elements of the wafer treatment apparatus 300 are disposed. The support plate 311 is provided in a disk shape overall, and has a diameter corresponding to the wafer W. Notches 313 are provided at an edge of the support plate 311. The notches 313 may have a shape corresponding to protrusions provided on the index arm 144c of the index robot 144 or the main arm 244c of the main robot 244. When the index arm 144c or the main arm 244c is aligned with the support plate 311 in a vertical direction and then vertical positions of the index arm 144c or the main arm 244c and the support plate 311 are changed, the wafer W may be transported therebetween.

The temperature control channel 315 may be mounted in the support plate 311. The temperature control channel 315 may provide a path through which a cooling fluid (or a fluid) flows. For example, the temperature control channel 315 may be provided in the form of a tube. The temperature control channel 315 may include one or more channels, and be mounted in the support plate 311 in various patterns. The temperature control channel 315 may be provided in a serpentine pattern over almost the entire surface of the support plate 311. For example, the fluid may be water. As another example, the fluid may be a liquid through which an electric current flows. As another example, to have a higher conductivity and to make an electric current flow by the movement of ions, the fluid may be a liquid including an ionic salt. The ionic salt may use a chlorine (Cl)-based salt soluble in water, e.g., LiCl, NaCl, $CaCl_2$, KCl, $MgCl$, or $BaCl_2$, or use a salt including $(NO_3)^-$, $SO_4^{2-}$, or $S^-$.

The temperature control channel 315 may provide coldness to the wafer W. When the wafer W is supported on the support plate 311, heat of the wafer W is transmitted to the support plate 311 and the support plate 311 may be cooled by the cooling fluid flowing through the temperature control channel 315. When this process is continued for a certain time, a temperature of the wafer W may be controlled.

Referring to FIGS. 3 to 5, a plurality of warpage measurers 317 are provided on the support plate 311. The warpage measurers 317 may be disposed in a shape protruding in the third direction 16 (or the Z-axis direction) from a horizontal plane in the first and second directions 12 and 14 (or an XY plane) of the support plate 311. When the wafer W is supported on the support plate 311, upper ends of the warpage measurers 317 may first come into contact with the lower surface of the wafer W.

The plurality of warpage measurers 317 may be disposed above the temperature control channel 315. The warpage measurers 317 may be mounted to be vertically spaced apart from an upper portion of the temperature control channel 315. Because the temperature control channel 315 is provided in a pattern over almost the entire surface of the support plate 311, the plurality of warpage measurers 317 may also be disposed to be uniformly distributed in several regions on the support plate 311.

A plurality of recesses 316 are provided in the upper surface of the support plate 311. The number of recesses 316 corresponds to the number of warpage measurers 317. The warpage measurers 317 may be disposed in the recesses 316. The recesses 316 are provided to be connected from the upper surface of the support plate 311 to the temperature control channel 315. Certain via holes (not shown) may be provided in upper portions of the temperature control channel 315 corresponding to the recesses 316. Lower ends of the warpage measurers 317 may contact the fluid of the temperature control channel 315 through the via holes (not shown). Certain sealing means (not shown) may be disposed between the warpage measurers 317 and the temperature control channel 315 or between the recesses 316 and the temperature control channel 315 to prevent the fluid from leaking.

Referring to an enlarged part of FIG. 5, each warpage measurer 317 may include an upper contact 317a, a lower contact 317b, and an elastic supporter 317c. The warpage measurer 317 is provided to be vertically retractable.

The upper contact 317a is provided in such a manner that an upper end thereof may contact the lower surface of the wafer W. The upper contact 317a is provided with a protrusion along a circumferential direction at a lower portion thereof and the protrusion is supported in the recess 316 to prevent the warpage measurer 317 from escaping upward.

The lower contact 317b is provided in such a manner that a lower end thereof may contact the fluid flowing through the temperature control channel 315. As described below, the lower contact 317b may include a conductive material to induce current signals at a contact position when in contact with the fluid.

The elastic supporter 317c is provided to elastically support the warpage measurer 317 in the recess 316. The elastic supporter 317c may use an elastic means such as a spring. The elastic supporter 317c may provide in the middle an empty space through which the lower contact 317b passes to contact the temperature control channel 315. The elastic supporter 317c may elastically support the upper and lower contacts 317a and 317b in the recess 316 to maintain a certain distance between the lower contact 317b and the temperature control channel 315 when an external force or a weight of the wafer W is not applied. When an external force or a weight of the wafer W is applied onto the upper contact 317a, the elastic supporter 317c may be compressed, the lower contact 317b may move downward, and thus the lower end thereof may contact the temperature control channel 315 or the fluid flowing through the temperature control channel 315.

Meanwhile, a dielectric 317d may be further provided between the upper and lower contacts 317a and 317b. The dielectric 317d may include a dielectric material. The dielectric 317d may serve as a capacitor when the warpage measurer 317 comes into contact with the fluid of the temperature control channel 315.

Meanwhile, at least one ground warpage measurer 317 may be further disposed on the support plate 311. The ground warpage measurer 317 may have the same configuration as the warpage measurer 317. However, the ground warpage measurer 317 may be provided not to contact the temperature control channel 315. That is, the ground warpage measurer 317 may be mounted not to be vertically spaced apart from the temperature control channel 315. Alternatively, the ground warpage measurer 317 may be mounted to be vertically spaced apart from the temperature control channel 315, and provided in a blocked state so as not to contact the temperature control channel 315. The ground warpage measurer 317 may be provided as the ground as described below in relation to FIG. 6.

Referring back to FIG. 3, a plurality of suckers 318 may be further provided on the support plate 311. The suckers 318 may be connected to an external suction means (not shown) such as a pump to apply a suction pressure onto the support plate 311. The suction pressure applied onto the support plate 311 may act on the lower surface of the wafer W such that the wafer W may be vacuum-supported by the support plate 311.

Support structures 320 are provided along the third direction 16 (or the Z-axis direction) to support a plurality of measurement structures 310 (or support plates 311). The support structures 320 are provided with a fluid supplier 322 for receiving the cooling fluid from outside the support plate 311, and a fluid discharger 324 for discharging the cooling fluid to the outside. The fluid supplier 322 and the fluid discharger 324 may be connected to an end and another end of the temperature control channel 315. Alternatively, the support structures 320 may include a distribution line (not shown) through which the cooling fluid flows, and the distribution line may be connected to the fluid supplier 322 and the fluid discharger 324. In this case, the temperature control channel 315 provided in each support plate 311 may be divided from the distribution line and connected to the fluid supplier 322 and the fluid discharger 324.

A first electrode may be connected to the end of the temperature control channel 315, and a second electrode may be connected to the other end thereof. The first and second electrodes may use a metal such as platinum (Pt), copper (Cu), silver (Ag), gold (Au), molybdenum (Mo), or aluminum (Al), a transparent material, a polymer, graphene, or the like. When a tube provided as the temperature control channel 315 is made of a conductive material such as a metal, the end and the other end thereof may function as the first and second electrodes. Referring to FIG. 4, an example in which the fluid supplier 322 is connected to the end of the temperature control channel 315 and the fluid discharger 324 is connected to the other end thereof is shown. In this case, tubes of the fluid supplier 322 and the fluid discharger 324 may serve as the first and second electrodes. The first and second electrodes may be provided as electrodes included in ends of first and second ammeters 330 and 340.

The first ammeter 330 may be connected to the first electrode (or the end of the temperature control channel 315 or the fluid supplier 322), and the second ammeter 340 may be connected to the second electrode (or the other end of the temperature control channel 315 or the fluid discharger 324). When at least any one warpage measurer 317 from among the plurality of warpage measurers 317 is in contact with the fluid of the temperature control channel 315, contact currents are induced at the contact point. The contact currents are induced from the first electrode to the contact point and from the second electrode to the contact point. The first ammeter 330 measures a current flowing from the first electrode to the contact point. The second ammeter 340 measures a current flowing from the second electrode to the contact point.

Meanwhile, a power source 350 for applying a voltage through the first and second electrodes to the temperature control channel 315 may be further provided.

A controller 360 may be electrically connected to the first and second ammeters 330 and 340 to obtain values of the currents measured by the first and second ammeters 330 and 340. The controller 360 may determine which warpage measurer 317 is in contact with the fluid of the temperature control channel 315, based on the measured current values.

Figure 6:
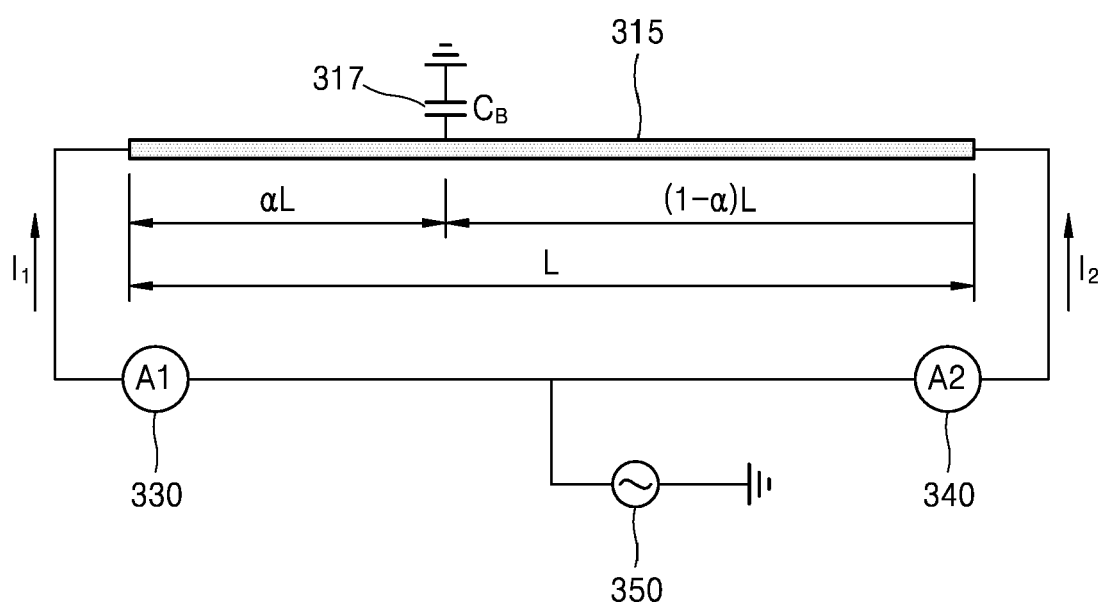
FIG. 6 is a schematic view showing a process of measuring a contact position between a temperature control channel and a warpage measurer, according to an embodiment of the present invention.

FIG. 6 is a schematic view showing a process of measuring a contact position between the temperature control channel 315 and the warpage measurer 317, according to an embodiment of the present invention.

Referring to FIG. 6, initially, a linearly straightened model of the temperature control channel 315 is set. The temperature control channel 315 is filled with a fluid, and thus may be considered as one long resistor. It is assumed that the wafer W applies its weight to one warpage measurer 317 and thus the warpage measurer 317 is in contact with the fluid of the temperature control channel 315. When the warpage measurer 317 is in contact with the fluid of the temperature control channel 315, a contact position may be calculated by detecting a change in capacitance formed in the fluid. In this regard, both ends of the temperature control channel 315 may be connected to first and second electrodes. Meanwhile, an alternating current (AC) voltage 350, e.g., −10V to 10V, may be applied within a stable range where electrochemical reaction does not occur at interfaces between the temperature control channel 315 and the first and second electrodes.

When the warpage measurer 317 is in contact with the fluid of the temperature control channel 315, the warpage measurer 317 may be capacitively connected to the fluid and thus a current may flow through the warpage measurer 317. In FIG. 6, the warpage measurer 317 is represented as a capacitor $C_a$. At least any one ground warpage measurer 317 from among the plurality of warpage measurers 317 may serve as the ground.

The temperature control channel 315 may include a resistive part and a capacitive part. The resistive part refers to virtual division of the temperature control channel 315 by the contact position. When the warpage measurer 317 is in contact with a point $\alpha$ on the temperature control channel 315 having a length L (where an end and another end of the temperature control channel 315 are expressed as $\alpha=0$ and $\alpha=1$), a left part of the contact point may have a length of $\alpha L$ and a right part thereof may have a length of $(1-\alpha)L$. A resistance value may be determined to be linearly proportional to the length virtually divided from the point $\alpha$. On the contrary, the capacitive part may have a constant value given by the warpage measurer 317.

Resistances to currents passing through two paths divided on the basis of the contact point are as shown in Equations 1 and 2 ($0 \leq \alpha \leq 1$).

$$R_1 = \alpha R \qquad \text{[Equation 1]}$$

$$R_2 = (1-\alpha)R \qquad \text{[Equation 2]}$$

A total current of the circuit considering impedance of each of the two divided paths is as shown in Equation 3.

$$I_{total} = \frac{V}{\frac{R_1 R_2}{R_1 + R_2} - j\frac{1}{2\pi f C_B}} \qquad \text{[Equation 3]}$$

The currents of the two paths are as shown in Equations 4 and 5.

$$I_1 \approx I_{total} \times \frac{R_2}{R_1 + R_2} = (1-\alpha)I_{total} \qquad \text{[Equation 4]}$$

$$I_2 \approx I_{total} \times \frac{R_1}{R_1 + R_2} = \alpha I_{total} \qquad \text{[Equation 5]}$$

When Equations 1 and 2 are substituted in Equations 4 and 5, Equations 7 and 8 are obtained as shown below.

$$(1-\alpha) = \frac{I_1}{I_t} \qquad \text{[Equation 7]}$$

$$\alpha = \frac{I_2}{I_t} \qquad \text{[Equation 8]}$$

Therefore, information about the contact position may be obtained using $I_1$ and $I_2$. That is, the contact position $\alpha$ may be calculated using currents $I_1$ and $I_2$ measured by the first and second ammeters 330 and 340. A sum $I_t$ of $I_1$ and $I_2$ is constant. For example, when the contact position moves rightward and thus $I_2$ increases, $I_1$ may linearly decrease to be inversely proportional to $I_2$.

Figure 7:
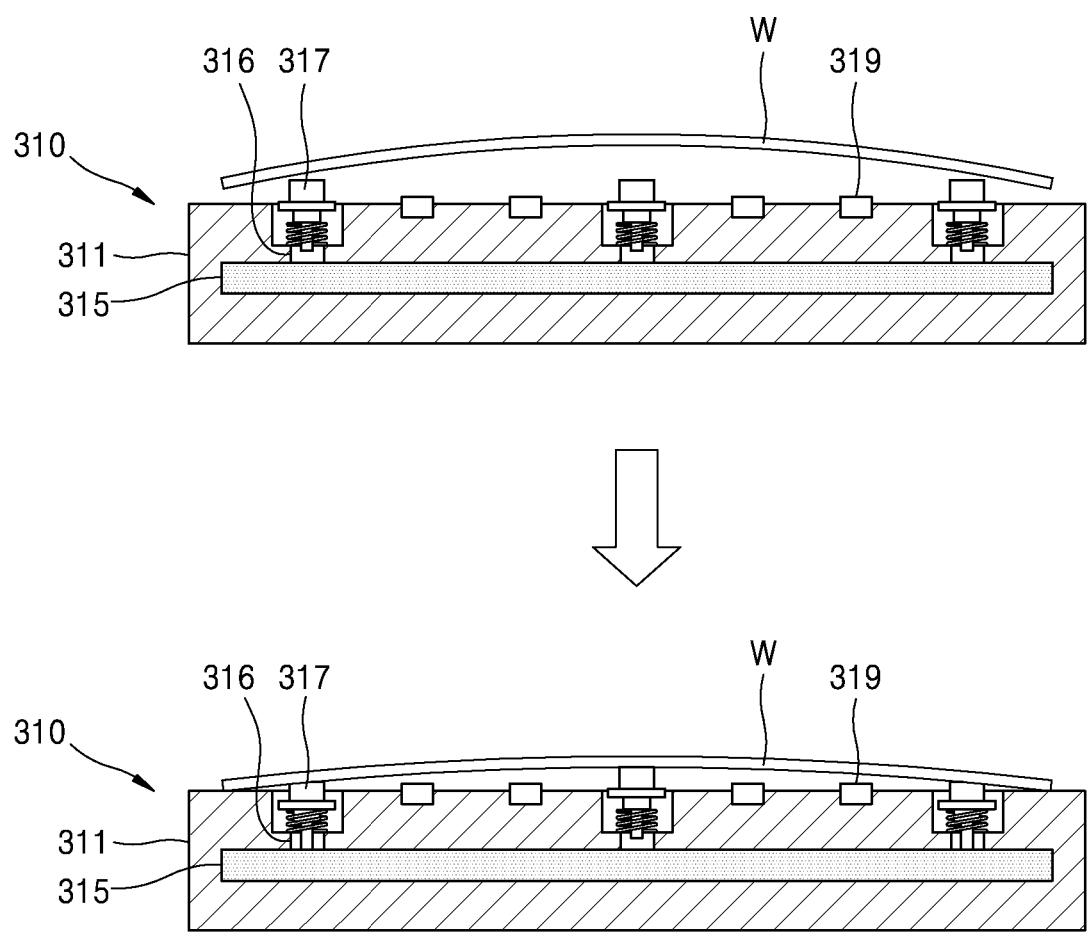
FIGS. 7 and 8 are schematic views showing a process of measuring warpage of a wafer, according to various embodiments of the present invention.
Figure 8:
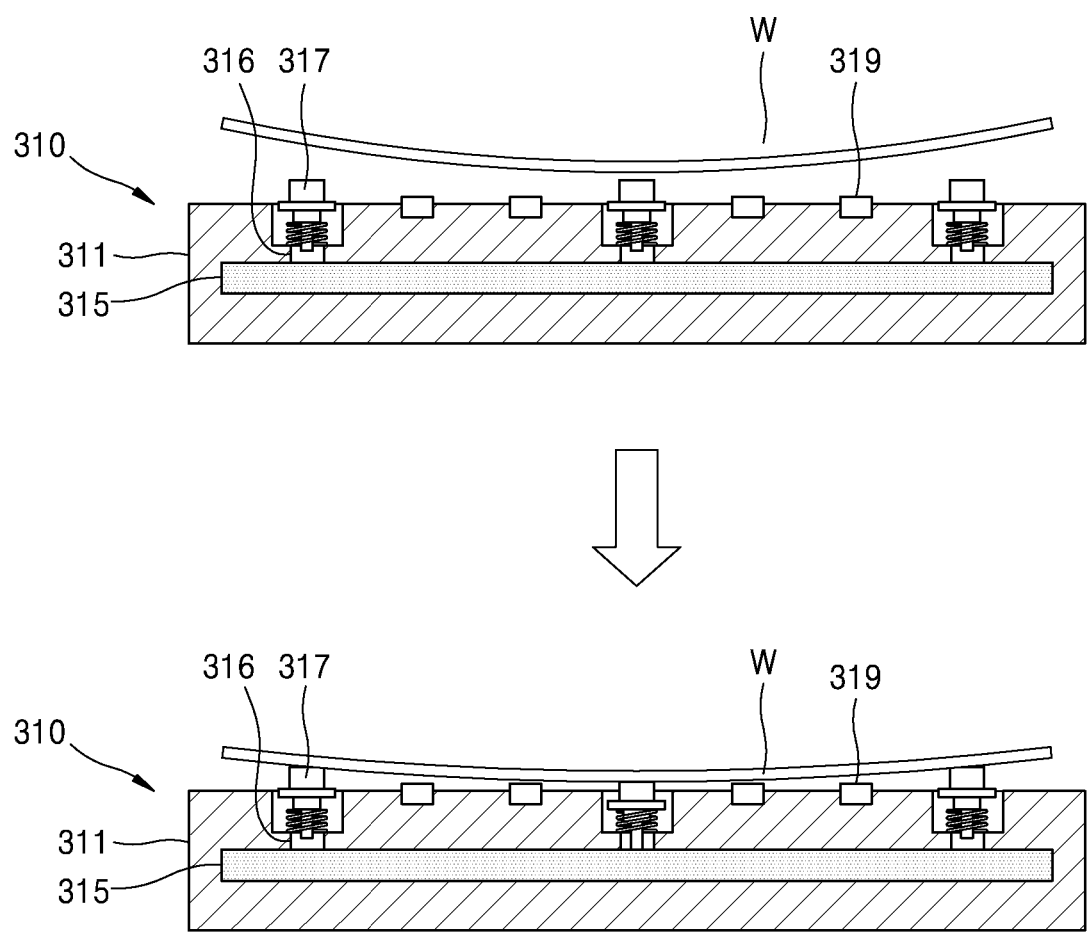

FIGS. 7 and 8 are schematic views showing a process of measuring warpage of a wafer, according to various embodiments of the present invention.

FIG. 7 shows a process of measuring convex warpage of the wafer W, according to an embodiment of the present invention. Referring to an upper part of FIG. 7, the wafer W having convex warpage may be loaded on the support plate 311. In this case, the warpage measurers 317 disposed at the edge of the support plate 311 first come into contact with the wafer W before the warpage measurer 317 disposed at the center of the support plate 311. Then, when a suction pressure is applied from the suckers 318 (see FIG. 3), the wafer W is drawn toward an upper surface of the support plate 311.

Thereafter, referring to a lower part of FIG. 7, the warpage measurers 317 corresponding to the edge of the wafer W are pressed first by a weight of the wafer W and the application of the suction pressure. Lower ends (or the lower contacts 317b) of the pressed warpage measurers 317 come into contact with a fluid of the temperature control channel 315. When the suction pressure is continuously applied and the wafer W is seated on proximity pins, the plurality of warpage measurers 317 may be sequentially pressed. The warpage measurers 317 may be pressed gradually from the warpage measurers 317 corresponding to the edge of the wafer W to the warpage measurer 317 corresponding to the center of the wafer W.

FIG. 8 shows a process of measuring concave warpage of the wafer W, according to an embodiment of the present invention. Referring to an upper part of FIG. 8, the wafer W having concave warpage may be loaded on the support plate 311. In this case, the warpage measurer 317 disposed at the center of the support plate 311 first comes into contact with the wafer W before the warpage measurers 317 disposed at the edge of the support plate 311. Then, when a suction pressure is applied from the suckers 318 (see FIG. 3), the wafer W is drawn toward an upper surface of the support plate 311.

Thereafter, referring to a lower part of FIG. 8, the warpage measurer 317 corresponding to the center of the wafer W is pressed first by a weight of the wafer W and the application of the suction pressure. A lower end (or the lower contact 317b) of the pressed warpage measurer 317 comes into contact with a fluid of the temperature control channel 315. When the suction pressure is continuously applied and the wafer W is seated on proximity pins, the plurality of warpage measurers 317 may be sequentially pressed. The warpage measurers 317 may be pressed gradually from the warpage measurer 317 corresponding to the center of the wafer W to the warpage measurers 317 corresponding to the edge of the wafer W.

Whenever the warpage measurer 317 is pressed, values of the currents $I_1$ and $I_2$ flowing through the temperature control channel 315 may be changed. The controller 360 may obtain positions where the warpage measurers 317 are in contact with the fluid, over time based on the current values $I_1$ and $I_2$ measured by the first and second ammeters 330 and 340. The controller 360 may determine that a portion of the wafer W corresponding to the warpage measurer 317 which comes into contact with the fluid earlier is warped downward. That is, the controller 360 may measure warpage of the wafer W by detecting at least two contact positions at different timings.

The above-described wafer treatment apparatus 300 of the present invention may measure warpage of the wafer W. The warpage of the wafer W may be measured in real time during a wafer treatment process by using a simple configuration for measuring currents based on the two ammeters 330 and 340, without using wires for receiving signals from a plurality of pressure sensors.

As described above, according to an embodiment of the present invention, warpage of a wafer may be measured.

In addition, according to an embodiment of the present invention, warpage of a wafer may be measured in real time during a wafer treatment process by using a simple configuration.

However, the scope of the present invention is not limited to the above effects.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A wafer treatment apparatus capable of measuring warpage of a wafer, the wafer treatment apparatus comprising:
    a support plate providing a surface on which the wafer is supported;
    a temperature control channel mounted in the support plate to provide a path through which a fluid flows; and
    a plurality of warpage measurers disposed on the support plate and having lower ends mounted to be vertically spaced apart from an upper portion of the temperature control channel,
    wherein, when the warpage measurers are pressed by a weight of the wafer, the lower ends of the warpage measurers come into contact with the fluid of the temperature control channel.

2. The wafer treatment apparatus of claim 1,
    wherein the plurality of warpage measurers are mounted at positions corresponding to a plurality of portions of the wafer, and
    wherein a certain warpage measurer corresponding to a portion positioned lower than a plane of the wafer due to warpage of the wafer is pressed first to contact the fluid of the temperature control channel.

3. The wafer treatment apparatus of claim 1,
    wherein the warpage measurers are disposed in recesses provided on the support plate, and
    wherein each warpage measurer comprises:
    an upper contact capable of contacting the wafer;
    a lower contact capable of contacting the fluid of the temperature control channel; and
    an elastic supporter elastically supporting the upper and lower contacts in a corresponding recess of the recesses.

4. The wafer treatment apparatus of claim 3,
    wherein, when a weight is not applied onto the upper contact, the elastic supporter maintain a certain distance between the lower contact and the temperature control channel.

5. The wafer treatment apparatus of claim 3,
    wherein the lower contact comprises a conductive material.

6. The wafer treatment apparatus of claim 5, further comprising a dielectric between the upper and lower contacts.

7. The wafer treatment apparatus of claim 1, further comprising at least one ground warpage measurer disposed on the support plate and mounted not to be vertically spaced apart from the temperature control channel.

8. The wafer treatment apparatus of claim 1,
    wherein a first electrode is connected to an end of the temperature control channel, and
    wherein a second electrode is connected to another end of the temperature control channel.

9. The wafer treatment apparatus of claim 8,
    wherein, when at least one warpage measurer from among the plurality of warpage measurers is in contact with the fluid of the temperature control channel, contact currents are induced from the first and second electrodes to a contact point where the fluid of the temperature control channel contacts at least one warpage measurer among the plurality of warpage measurers.

10. The wafer treatment apparatus of claim 9,
wherein a first ammeter is connected to the first electrode,
wherein a second ammeter is connected to the second electrode, and
wherein the wafer treatment apparatus further comprises a controller for obtaining values of currents measured by the first and second ammeters.

11. The wafer treatment apparatus of claim 10,
wherein, when a length of the temperature control channel is denoted by L and a total current flowing through the temperature control channel is denoted by It, and when the warpage measurer is in contact with the fluid at a portion corresponding to αL from the end of the temperature control channel and (1−α) L from the other end of the temperature control channel, the controller obtains a contact position α as shown in:

$$(1-\alpha)=I1/It; \quad \text{Equation (1)}$$

and $$\alpha=I2/It, \quad \text{Equation (2)}$$

where I1 denotes a current value measured by the first ammeter, I2 denotes a current value measured by the second ammeter, and 0≤α≤1.

12. The wafer treatment apparatus of claim 11,
wherein the controller measures warpage of the wafer by obtaining at least two contact positions α.

13. The wafer treatment apparatus of claim 10,
wherein, when a current value measured by the first ammeter is denoted by I1 and a current value measured by the second ammeter is denoted by I2, a sum of I1 and I2 is constant, and I1 and I2 have inversely proportional values based on a contact position between the fluid of the temperature control channel and the warpage measurer.

14. The wafer treatment apparatus of claim 1, further comprising:
a fluid supplier connected to an end of the temperature control channel to supply the fluid to the temperature control channel; and
a fluid discharger connected to another end of the temperature control channel to discharge the fluid from the temperature control channel.

15. The wafer treatment apparatus of claim 1,
wherein the temperature control channel controls a temperature of the wafer supported on the support plate, by providing coldness to the support plate.

16. The wafer treatment apparatus of claim 1, further comprising a plurality of suckers provided on the support plate to apply a suction pressure to a lower surface of the wafer supported on the support plate.

17. A method of measuring warpage of a wafer by using a wafer treatment apparatus comprising a support plate providing a surface on which the wafer is supported, a temperature control channel mounted in the support plate to provide a path through which a fluid flows, and a plurality of warpage measurers disposed on the support plate and having lower ends mounted to be vertically spaced apart from an upper portion of the temperature control channel, the method comprising:
mounting the plurality of warpage measurers at positions corresponding to a plurality of portions of the wafer;
pressing a first warpage measurer, among the plurality of warpage measures, corresponding to a portion positioned lower than a plane of the wafer due to warpage of the wafer to contact the fluid of the temperature control channel, wherein contact currents are induced from the temperature control channel to a contact point between the first warpage measurer and the temperature control channel;
measuring a first current I1at an end of the temperature control channel and a second current, at another end of the temperature control channel, wherein current values of the first current and the second current are denoted by I1 and I2, respectively, and a sum of the first current and the second current is constant, and the first current and the second current have inversely proportional values based on a contact position between the fluid of the temperature control channel and the first warpage measurer; and
calculating a ratio of the first current to the second current to obtain the contact position.

18. The method of claim 17,
wherein warpage of the wafer is measured by detecting at least two contact positions.

19. A wafer treatment apparatus capable of measuring warpage of a wafer, the wafer treatment apparatus comprising:
a support plate providing a surface on which the wafer is supported;
a temperature control channel mounted in the support plate to provide a path through which a fluid flows;
a plurality of warpage measurers disposed on the support plate and having lower ends mounted to be vertically spaced apart from an upper portion of the temperature control channel;
a first electrode and first ammeter connected to an end of the temperature control channel; and
a second electrode and second ammeter connected to another end of the temperature control channel,
wherein the plurality of warpage measurers are mounted at positions corresponding to a plurality of portions of the wafer,
wherein a first warpage measurer, among the plurality of warpage measurers, corresponding to a portion positioned lower than a plane of the wafer due to warpage of the wafer is pressed first to contact the fluid of the temperature control channel,
wherein, when the first warpage measurer is in contact with the temperature control channel, contact currents are induced from the first and second electrodes to a contact point where the temperature control channel contacts the first warpage measurer, and a controller obtains values of currents measured by the first and second ammeters, and
wherein, when a length of the temperature control channel is denoted by L and a total current flowing through the temperature control channel is denoted by It, and when the first warpage measurer is in contact with the fluid at a portion corresponding to αL from the end of the temperature control channel and (1−α) L from the other end of the temperature control channel, the controller obtains a contact position α as shown in:

$$(1-\alpha)=I1/It; \quad \text{Equation (1)}$$

and $$\alpha=I2/It, \quad \text{Equation (2)}$$

where I1 denotes the current measured by the first ammeter, I2 denotes the current measured by the second ammeter, and 0≤α≤1, and measures warpage of the wafer by obtaining at least two contact positions $\alpha$.

\* \* \* \* \*